(12) United States Patent
Coll et al.

(10) Patent No.: US 6,596,187 B2
(45) Date of Patent: Jul. 22, 2003

(54) METHOD OF FORMING A NANO-SUPPORTED SPONGE CATALYST ON A SUBSTRATE FOR NANOTUBE GROWTH

(75) Inventors: Bernard F. Coll, Fountain Hills, AZ (US); Yi Wei, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 141 days.

(21) Appl. No.: 09/942,456

(22) Filed: Aug. 29, 2001

(65) Prior Publication Data

US 2003/0042226 A1 Mar. 6, 2003

(51) Int. Cl.$^7$ .............................................. C23C 16/26
(52) U.S. Cl. ........................ 216/56; 216/100; 423/447.3
(58) Field of Search ................ 216/56, 100; 423/447.3; 205/118, 188

(56) References Cited

U.S. PATENT DOCUMENTS

| | | | |
|---|---|---|---|
| 5,689,319 A | * 11/1997 | Vink et al. | ............. 349/110 |
| 6,078,133 A | 6/2000 | Menu et al. | |
| 6,100,628 A | 8/2000 | Coll et al. | |
| 6,129,901 A | * 10/2000 | Moskovits et al. | ...... 423/447.3 |
| 6,270,571 B1 | * 8/2001 | Iwasaki et al. | ............. 117/88 |
| 6,278,231 B1 | * 8/2001 | Iwasaki et al. | ............. 445/50 |
| 6,294,450 B1 | * 9/2001 | Chen et al. | ............. 438/689 |
| 6,297,063 B1 | * 10/2001 | Brown et al. | ............. 438/2 |
| 6,333,016 B1 | * 12/2001 | Resasco et al. | ............. 423/447.3 |
| 6,350,488 B1 | * 2/2002 | Lee et al. | ............. 438/694 |
| 6,464,853 B1 | * 10/2002 | Iwasaki et al. | ............. 205/118 |
| 6,465,132 B1 | * 10/2002 | Jin | ............. 429/231.8 |
| 6,514,113 B1 | * 2/2003 | Lee et al. | ............. 445/50 |

FOREIGN PATENT DOCUMENTS

| | | | |
|---|---|---|---|
| EP | 1061043 A1 | * 12/2000 | ........... C01B/31/02 |
| EP | 1102298 A1 | * 5/2001 | ........... H01J/1/30 |
| EP | 1134304 A2 | * 5/2001 | ........... C23C/16/44 |
| WO | WO-90/00208 A1 | * 1/1990 | ........... C25D/5/16 |

* cited by examiner

Primary Examiner—Robert Kunemund
Assistant Examiner—Terrence M. Mackey
(74) Attorney, Agent, or Firm—William E. Koch

(57) ABSTRACT

A method of forming a nano-supported sponge catalyst (10) on a substrate (12) is comprised of depositing an active catalytic metallic element (16) on the substrate (12) and depositing a structural metallic element (18) with the active catalytic metallic element (16) to form a mixed metal alloy layer (14). The method is further comprised of etching the mixed metal alloy layer (14) with an etchant to oxidize the active catalytic metallic element (16) and the structural metallic element (18) and to remove at least a portion of the structural metallic element (18) from a first sub-layer of the mixed metal alloy layer (14). The first sub-layer of the mixed metal alloy layer (14) is porous and comprised of nano-particles of the active catalytic metallic element (16) that are supported by a metal oxide structure derived from the structural metallic element (18).

30 Claims, 4 Drawing Sheets

US 6,596,187 B2

1

METHOD OF FORMING A NANO-SUPPORTED SPONGE CATALYST ON A SUBSTRATE FOR NANOTUBE GROWTH

FIELD OF THE INVENTION

The present invention generally relates to a nano-supported sponge catalyst on a substrate, and more particularly to a nano-supported sponge catalyst on a substrate for nanotube growth.

BACKGROUND OF THE INVENTION

A nanotube, and more specifically a carbon nanotube, is known to be useful for providing electron emission in a vacuum device, such as a field emission display. The use of a carbon nanotube as an electron emitter has reduced the cost of vacuum devices, including the cost of a field emission display. The reduction in cost of the field emission display has been obtained with the carbon nanotube replacing other electron emitters (e.g., a Spindt tip), which generally have higher fabrication costs as compared to a carbon nanotube based electron emitter.

The manufacturing costs for vacuum devices (e.g., a field emission display) that use a carbon nanotube can be further reduced if the carbon nanotube is grown on the field emission substrate from a catalytic surface using chemical vapor deposition or other film deposition techniques. Nanotube growth can be conducted as a last deposition process preventing the degradation of the electron emitter properties by other device processing techniques or steps (e.g., wet processes). To further reduce costs for vacuum devices, it is also desirable to construct the field emission substrate from materials such as borosilicate glass or sodalime glass. However, borosilicate glass and sodalime glass cannot generally tolerate temperatures above about sixty hundred and fifty degrees Celsius (650° C.). In addition, the tolerance of borosilicate glass and sodalime glass is further reduced if the borosilicate glass or sodalime glass is subjected to temperatures above about sixty hundred and fifty degrees Celsius (650° C.) for an extended period or forces are applied to the borosilicate glass or sodalime glass at such temperatures.

In view of the foregoing, it is desirable to provide a nano-supported sponge catalyst on a field emission substrate for carbon nanotube growth that allows such a carbon nanotube to be grown on the field emission substrate that has a deformation temperature below about six hundred and fifty degrees Celsius (650° C.). Furthermore, additional desirable features will become apparent to one skilled in the art from the drawings, foregoing background of the invention and following detailed description of a preferred exemplary embodiment, and appended claims.

BRIEF DESCRIPTION OF THE DRAWINGS

The present invention will hereinafter be described in conjunction with the appended drawing figures, wherein like numerals denote like elements, and.

2

Figure 6:
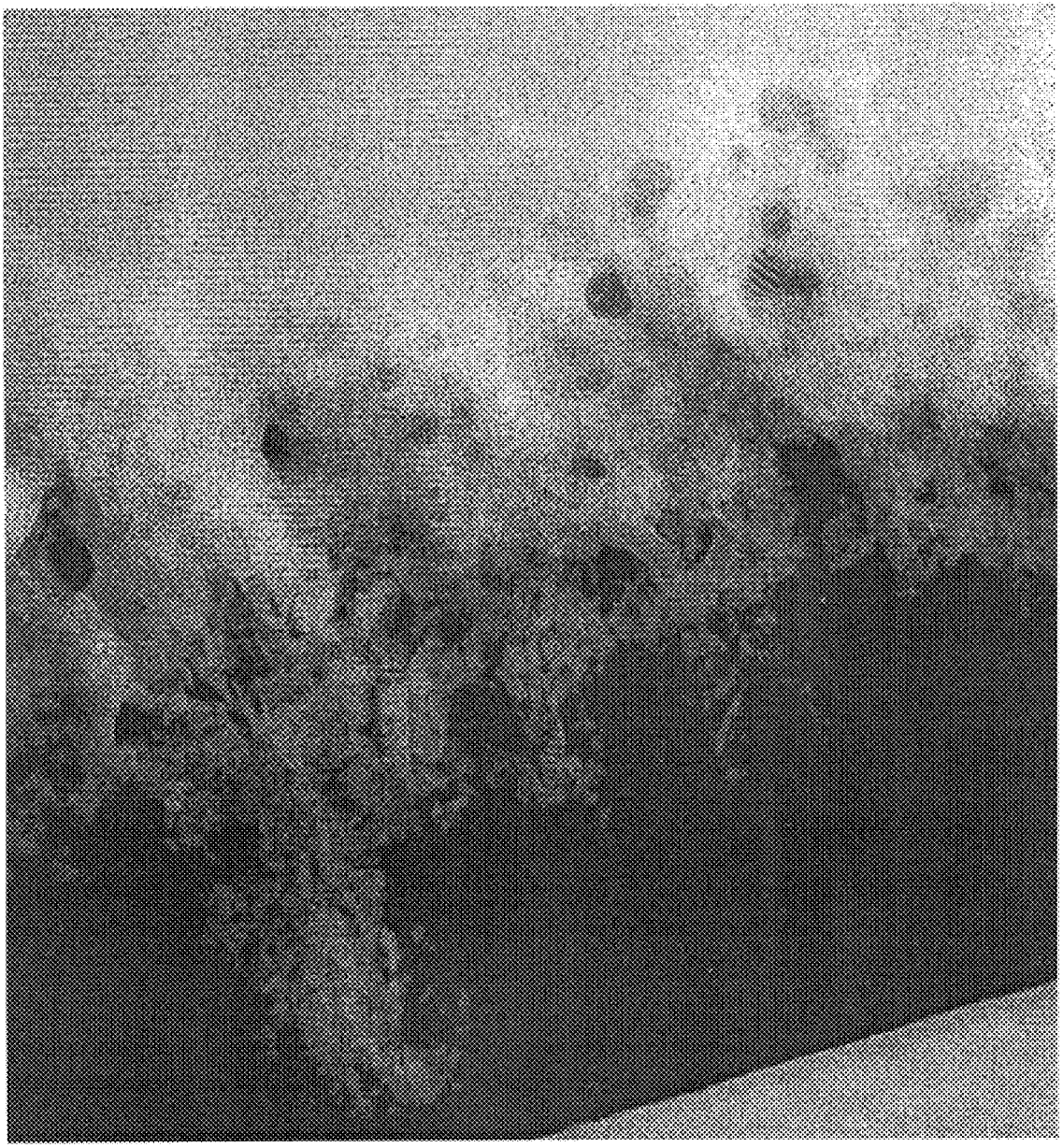
Figure 7:
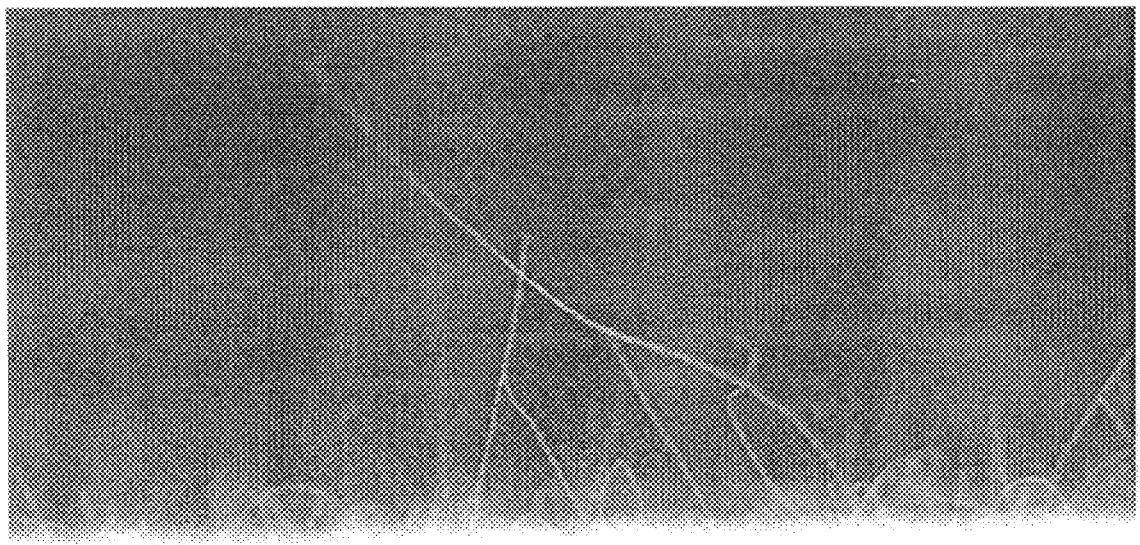

FIG. 6 is a high resolution transmission electron microscopy cross section view of the Ni—Al nano-supported sponge catalyst according to a preferred exemplary embodiment of the present invention; and FIG. 7 is a high resolution scanning electron microscopy cross section view of carbon nanotubes that have grown on the surface of the Ni—Al nano-supported sponge catalyst according to a preferred exemplary embodiment of the present invention.

DETAILED DESCRIPTION OF PREFERRED EXEMPLARY EMBODIMENTS

The following detailed description of preferred embodiments is merely exemplary in nature and is not intended to limit the invention or the application and uses of the invention. Furthermore, there is no intention to be bound by any theory presented in the preceding background of the invention or the following detailed description of preferred exemplary embodiments.

Figure 1:
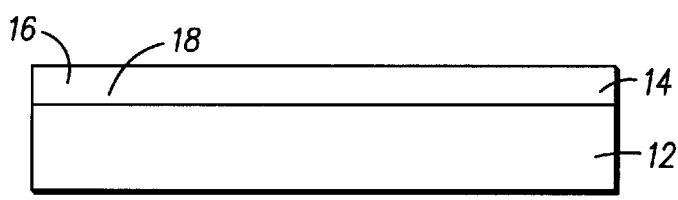
FIGS. 1–3 are an illustration of a method for forming a nano-supported sponge catalyst according to a preferred exemplary embodiment of the present invention.
Figure 2:
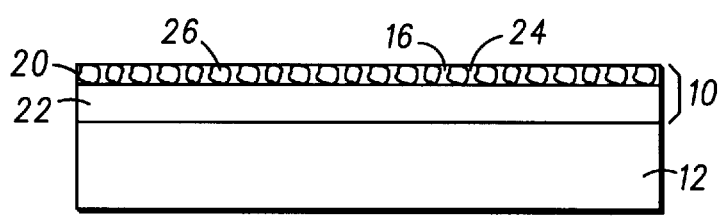
Figure 3:
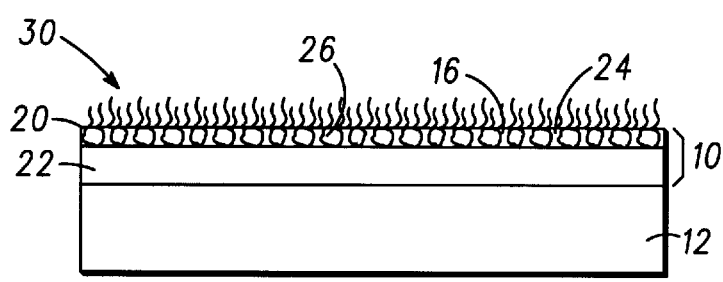

Referring to FIGS. 1–3, a method is illustrated for forming a nano-supported sponge catalyst 10 on a substrate 12 that can be used to grow nanotubes and more preferably carbon nanotubes according to a preferred exemplary embodiment of the present invention. The method begins with depositing at least two metallic elements on the substrate 12 to form a mixed metal alloy film 14 on the substrate. The deposition of the metallic elements can be achieved in any number of conventional techniques such as co-evaporation, co-sputtering, electro-deposition, laser ablation, or arc evaporation.

The substrate 12 is preferably borosilicate glass or sodalime glass, however any number of materials can be used as the substrate, such as other glasses, silicon, semiconductors, carbon, ceramics, metals or composite materials. The mixed metal alloy film 14 is comprised of at least two metallic elements that are preferably dispersed in a substantially uniform manner. The first metallic element is an active catalytic metallic element 16 and the second metallic element is a structural metallic element 18. The structural metallic element 18 preferably maintains the nano-scale dimensions of the nano-supported sponge catalyst 10 through the useful temperature of the catalytic process (e.g., about five hundred degrees Celsius (500° C.) to about one thousand degrees Celsius (1,000° C.) for hot filament chemical vapor deposition (HFCVD)), and prevents the active catalytic metallic element 16 from coalescing during such process. It is preferred that the structural metallic element 18 is a metal oxide. The active catalytic metallic element 16 and the structural catalytic metallic element 18 should have different electrochemical selectivity thereby permitting the selective dissolution of the structural metallic element 18 during a subsequent etching process.

Examples of a suitable active catalytic metallic element 16 include titanium, vanadium, chromium, manganese, copper, zirconium, niobium, molybdenum, technetium silver, hafnium, tantalum, tungsten, rhenium, gold; and preferably, ruthenium, rhodium, palladium, osmium, iridium, platinum; and more preferably iron, cobalt, nickel, or a combination thereof. Examples of a suitable structural metallic element 18 include, for example, silicon, magnesium, and preferably aluminum. The concentration or composition of the active catalytic metallic element 16 and the structural metallic element 18 is controlled by the deposition conditions of each of the metallic elements (16, 18) such as electrical discharge, partial pressure, temperature, and evaporation rate. The composition of the mixed alloy metal film 14 influences the final structure of the nano-supported sponge catalyst and determines the activity of the nano-supported sponge catalyst for cracking the hydrocarbon gas (e.g., methane) during HFCVD.

The preferred composition of the mixed metal alloy film 14 contains at least about fifty percent (50%) of the active catalytic metallic element 16. The thickness of the mixed metal alloy film 14 is a function of the desired application for the catalyst 10. In some catalytic applications, the thickness of the mixed metal alloy film 14 can reach a few microns. However, for growing carbon nanotubes to be used in a field emission display, the mixed metal alloy film 14 preferably has a thickness that is less than about one micron (1 μm). More preferably, the mixed metal alloy film 14 preferably has a thickness that is less than about two hundred nanometers (200 nm), even more preferably less than one hundred and fifty nanometers (150 nm) and most preferably less than about one hundred nanometers (100 nm).

In a preferred exemplary embodiment, the deposition of the active catalytic metallic element 16 and the structural metallic element 18 on the substrate 12 is achieved by co-evaporation. The co-evaporation begins with introducing the substrate 12 to a vacuum environment. The vacuum environment is preferably less than about $1 \times 10^{-6}$ torr and can be created with any number of devices, including, but not limited, to a vacuum chamber. The active catalytic metallic element 16 and the structural metallic element 18 are co-evaporated onto the substrate 14 to form the mixed metal alloy film 14 on the substrate 12. The coevaporation of the active catalytic metallic element 16 and the structural metallic element 18 can be performed using any number of conventional apparatuses and methods.

In another preferred exemplary embodiment of the present invention, the mixed metal alloy film 14 is formed by electro-deposition of the active catalytic metallic element 16. Preferably, a low electrochemical metal (e.g., nickel, cobalt or iron) and the structural metallic element 18 are formed onto an electrically conductive substrate (e.g., substrate with an electrode). The electric current supplied to the electro-deposition solution can be increased or decreased to control the surface area and the electrochemical activity leading to the formation of the mixed metal alloy film 14.

In yet another preferred exemplary embodiment of the present invention, an additional element 50 is utilized to promote better catalytic activity of the nano-supported sponge catalyst 10, along with the active catalytic metallic element 16 and the structural metallic element 18, and can be deposited onto the substrate 12 to form the mixed metal alloy film 14. Examples of a suitable additional element 50 include, for example, calcium, tantalum, hafnium, and zirconium.

After the forming of the mixed metal alloy film 14 on the substrate 12, the method continues with the etching of the mixed metal alloy film 14 to at least partially removed and selectively oxidized the structural metallic element 18 to form a nano-supported sponge catalyst 10. The etchant targets the structural metallic element 18 because it is the most electrochemically active element of the mixed metal alloy film 14. Any number of dry or wet etch techniques can be used to etch the mixed metal alloy film 14 and the etchant, etchant concentration and etch time are preferably selected to provide the partial removal and selective oxidization of the structural metallic element 18. The etching can be achieved by immersing (e.g., spinning, spraying, dip coating, etc.) the mixed metal alloy film 14 on the substrate 12 in an etching solution, preferably for approximately thirty (30) seconds to approximately forty (40) minutes, more preferably for approximately five (5) minutes to approximately fifteen (15) minutes. Examples of suitable etching solution include, for example, $NH_4OH$, an alkali metal hydroxide (e.g., NaOH, KOH), and an acid (e.g., nitric acid, HCl).

The partial removal and selective oxidation of the structural metallic element 18 by the etchant is created by a kinetic roughening transition. This roughening transition results from a competition between a roughening process (i.e., removal of the structural metallic element 18) and a smoothing process (e.g., surface diffusion, volume diffusion, or dissolution/re-deposition). For a mixed metal alloy film 14 below a critical alloying composition (e.g., containing at least about fifty percent (50%) of the active catalytic metallic element 16), the structural metallic element 18 is removed from the first few surface atomic sub-layers of the mixed metal alloy film 14. This results in an enrichment of the active catalytic metallic element 16 in those sub-layers and the slowing of the dissolution process. Above a critical alloying composition, the structural metallic element 18 dissolution rate is sufficient enough to develop a nano-porous support structure following the predefined interconnected channels of the structural metallic element 18 within the mixed metal alloy film 14 and the structural metallic element 18 composition is above the percolation threshold. The dissolution process continues to follow these pathways as the smoothing process results in the coarsening of the three-dimensional structure in an attempt to minimize the overall surface energy. The coarsening allows for further penetration of the electrolyte into the mixed metal alloy film 14.

Figure 4:
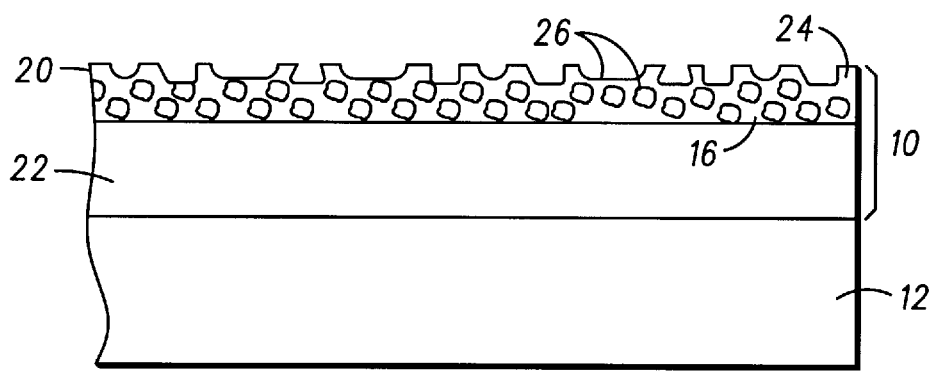
FIG. 4 is an illustration of a nano-supported sponge catalyst formed according to a preferred exemplary embodiment of the present invention.
Figure 5:
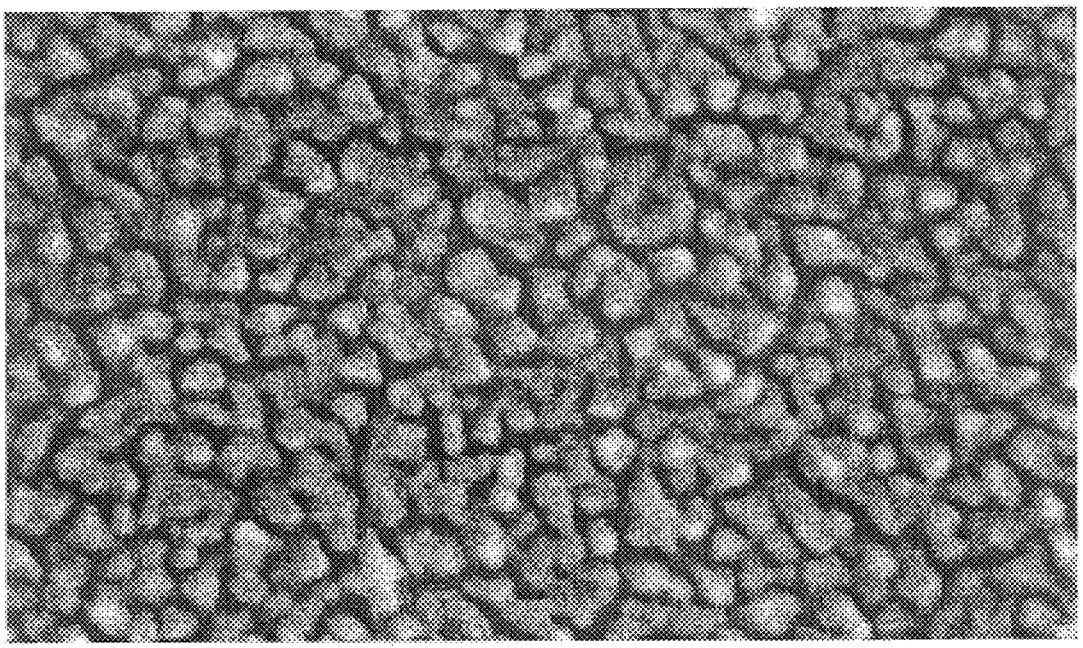
FIG. 5 is a high resolution scanning electron microscopy plan view of a Ni—Al nano-supported sponge catalyst according to a preferred exemplary embodiment of the present invention.

Referring to FIG. 4, the nano-supported sponge catalyst 10 resulting from the etching of the mixed metal alloy film 14 has a porous or "sponge" like top sub-layer 20 in electrical contact with a mixed metal alloy sub-layer 22. (See FIG. 5 for a high-resolution scanning electron microscopy plan view of a Ni—Al nano-supported sponge catalyst and FIG. 6 for a high-resolution transmission microscopy cross-section of the nano-supported sponge catalyst.) The porous top sub-layer 20 is comprised of a dispersed active catalytic metallic element nano-particles 16 (e.g., about one million nano-particles per $1 \times 10^{-6}$ cm$^2$) supported by a metal oxide structure 24 derived from the structural metallic element 18 and filled with nano-pores 26 and tunnel structures (not shown) that are interconnected and random in direction. This nano-support porous structure of the porous top sub-layer 20 is formed because the etching chemically drove the active catalytic metallic element atoms 16 to aggregate into clusters by a phase separation process at the solid-electrolyte interface, and increased the surface area to a volume ratio of the mixed metal alloy film 14. Unaffected by the etching, the composition of the mixed metal alloy sub-layer 22 is the substantially the same as the mixed metal alloy film 14.

Unlike other conventional catalysts that generally have active catalytic metallic element particles, which are larger than one micron (1 μm), the nano-supported sponge catalyst 10 formed according to the present invention has active catalytic metallic element nano-particles 16 that are about one-tenth of a nanometer (0.1 nm) to about five hundred nanometers (500 nm). More preferably, the nano-supported sponge catalyst 10 formed according to the present invention has active catalytic metallic element nano-particles 16 that are less than about fifty nanometers (50 nm), more preferably less than about ten nanometers (10 nm), even more preferably less than about seven nanometers (7 nm) and most preferably less than about three nanometers (3 nm). The nano-pores 26 are generally irregular in shape and size. The size and distribution of the nano-pores 26 are dependent upon the electrolyte composition and concentration, the mixed metal alloy film 14 composition and concentration, and the etching rate and time.

The nano-support provided by the metal oxide structure 24 maintains the nano-scale dimensions of the active catalytic metallic element nano-particles 16 through the useful temperature of the catalytic process including the chemical process required for growing nanotubes (e.g., HFCVD) discussed below and prevent the active catalytic metallic element nano-particles 16 from coalescing during such process. The nano-support renders the active catalytic metallic element nano-particle size independent of the nano-supported sponge catalyst layer thickness and temperature cycle. Furthermore, the metal oxide structure 24 can prevent diffusion of poisons to the nano-supported sponge catalyst 10 and can enhance its chemical reactivity. Due to its nano-supported porous structure, the nano-supported sponge catalyst has a high surface area to volume ratio, preferably greater than about fifty meter square per gram (50 $m^2/g$), more preferably greater than about one hundred meter square per gram (100 $m^2/g$), and most preferably greater than about one hundred and fifty meter square per gram (150 $m^2/g$).

For example, a mixed metal alloy film 14 containing about fifty percent (50%) of an active catalytic metal element 16 of nickel (Ni) and fifty percent (50%) of a structural metal element 18 of aluminum (Al) can be wet etched in an alkaline or NH4OH solution to partially remove and selectively oxidize the aluminum constituent ($Al_2O_3$). This forms a nickel-aluminum nano-supported sponge catalyst having a porous sub-layer with dispersed nickel nano-particles. The nickel nano-particles are dispersed with about one million nano-particles per $1 \times 10^6/cm^2$. The nickel nano-particles are approximately three nanometers (3 nm) to approximately seven nanometers (7 nm) (i.e., diameter, length, width, or depth) and embedded in a aluminum metal oxide nano-support with an area to volume ratio of about eighty to one hundred meter square per gram (80–100 $m^2/g$).

Once the nano-supported sponge catalyst 10 is formed, the substrate 12 with the nano-supported sponge catalyst 10 is preferably exposed to a drying process (not shown). The drying process can be accomplished with any conventional method. For example, the substrate 12 with the nano-supported sponge catalyst 10 is dried with the application of an airflow. After the drying process is conducted, the method continues with the growing of nanotubes, which are preferably carbon nanotubes 30, on the catalyst 10 with a chemical reaction process such as catalytic decomposition, pyrolysis, or chemical vapor deposition (CVD), and preferably hot filament chemical vapor deposition (HFCVD). The techniques for conducting these chemical reaction processes are well known in the art.

The nanotube growth temperature of the substrate 12 during the chemical reaction process is a function of the substrate 12. For example, the nanotube growth temperature of a substrate 12 of borosilicate glass is preferably less than about six hundred and fifty degrees Celsius (650° C.), more preferably less than about six hundred degrees Celsius (600° C.) and most preferably less than about six hundred degrees Celsius and greater than about five hundred degrees Celsius (500° C.). As one skilled in the art can appreciate, the nanotube growth temperature of other suitable substrates may be higher than about six hundred and fifty degrees Celsius (650° C.).

In a preferred embodiment, HFCVD is used to grow carbon nanotubes 30 at the location of the nano-supported sponge catalyst 10. HFCVD begins with introducing the substrate 12 having the nano-supported sponge catalyst 10 into a CVD growth chamber. A refractory metal filament (e.g., tungsten, platinum, rhenium, tantalum) is heated to a temperature above about nineteen hundred degrees Celsius (1900° C.) in vacuum or as molecular hydrogen is flowed over the refractory metal filament. Carbon containing gases such as methane, acetylene, and xylene can also be flowed over the filament to provide a carbon source for nanotube growth.

More specifically, the substrate 12 with the nano-supported sponge catalyst 10 is placed over a thermally conducting substrate holder (e.g., graphite) that is placed in a predefined location with respect to the hot filament (e.g., below the hot filament). The substrate holder can be a heater or it can be thermally connected to a heater. This configuration of the substrate 12 with the nano-supported sponge catalyst 10 and the hot filament allows the temperature of the substrate (i.e., the nanotube growth temperature) to be independently controlled from the hot filament temperature. During the growth of at least one carbon nanotube, and more preferably multiple carbon nanotubes 30 on the nano-supported sponge catalyst 10 of the substrate 12, the distance between the hot filament and the substrate 12 is controlled to provide a temperature of the substrate 12 (i.e., the nanotube growth temperature). For example, a distance of about one-half to about two centimeters (0.5 cm to 2 cm) between the hot filament and the substrate 12 is provided for a nanotube growth (or substrate) temperature ranging from about three hundred and fifty degrees Celsius (350° C.) to about six hundred degrees Celsius (600° C.).

Once the temperature of the substrate 12 is elevated to the growth temperature, a carbon source is preferably introduced into the CVD growth chamber. Any hydrocarbon or carbon-compound (e.g., methane, carbon monoxide, etc.) can be used as the carbon source. For example, a gas mixture of hydrogen ($H_2$) and methane ($CH_4$) can be used as the hydrocarbon source, with a flow rate of about one hundred standard cubic centimeters per minute (100 sccm) for hydrogen and about forty standard cubic centimeters per minute (40 sccm) for methane. The methane is diluted by the hydrogen ($H_2$) and thermally disassociated and activated with the hot filament. The ratio of the methane ($CH_4$) to hydrogen ($H_2$) is preferably maintained with the range of twenty percent (20%) to forty percent (40%) and the pressure of the CVD growth chamber is maintained at about twenty (20) torr to fifty (50) torr. The simultaneous production of atomic hydrogen during hydrocarbon pyrolysis enhances the deposition of the carbon nanotubes 30 and the growth of the carbon nanotubes 30 is discontinued when the length of the carbon nanotubes 30 is a desired length for a particular application (e.g., the tips of the carbon nanotubes 30 have grown to level of the gate aperture).

The nano-supported sponge catalyst 10 provided on the substrate 12 with the method of the present invention allow nanotubes and more preferably carbon nanotubes to be selectively and sparsely grown on a micro-pattern (i.e., sub-pixel or quantum dots). (See FIG. 7 for a high-resolution scanning electron microscopy cross-section of carbon nanotubes grown on the surface of a Ni—Al nano-supported sponge catalyst.) The present invention provides single wall and multi-wall nanotubes having a substantially uniform structure. The nanotubes formed according to the present invention preferably have a diameter less than about twenty nanometers (20 nm) and more preferably a diameter that is greater than about one nanometer (1 nm) and less than about three nanometers (3 nm). In addition, the nanotubes formed according to the present invention preferably have an aspect ratio, defined as height of the nanotube to the width of the nanotube, which is about one hundred and forty (140) to about four thousand five hundred (4,500). More preferably, the aspect ratio of the nanotubes formed according to the present invention is about one thousand (1,000) to three thousand five hundred (3,500) with a substantially perpendicular orientation with respect to the surface of the substrate.

A field emission display having the preferred carbon nanotubes configured as electron emitters can have a triode geometry from about one-tenth of a micron (0.10 $\mu$m) to about twenty-five microns (25 $\mu$m), a gate spacing less than about twenty-five microns (25 $\mu$m) and a switching voltage that is less than about eighty (80) volts with a cathode current in the range of greater than about one and a half milliamps per square centimeter (1.5 mA/cm$^2$). Furthermore, the preferred nanotubes have significant dispersion in that the spacing between the nanotubes is about twenty nanometers (20 nm) to two thousand nanometers (2,000 nm) and grown by the nano-supported sponge catalyst that has active catalytic metallic element particles 16 that are preferably less than about ten nanometers (10 nm), more preferably less than about seven nanometers (7 nm), and most preferably about three nanometers (3 nm).

In another preferred exemplary embodiment of the present invention, the substrate 12 of method previously described in this detailed description of preferred embodiments is replaced by a support substrate having an electrode. The processing steps are generally and substantially the same as previously described in this detailed description of preferred embodiments, but is further comprised of patterning the mixed metal alloy film 14 before the etching. Patterning the mixed metal alloy film 14 can be completed using standard and well known photolithographic methods such as selectively depositing, exposing and removing a photoresist layer over the mixed metal alloy film 14 so that the mixed metal alloy film 14 has an unexposed portion that is covered by a photoresist and an exposed portion that is absent of the photoresist. Thereafter, the exposed portion of the mixed metal alloy film 14 is removed using standard photolithographic techniques. Finally, the photoresist on the unexposed portion of the conductive alloy layer is removed using standard photolithographic techniques leaving a patterned mixed metal alloy film 14 on the support substrate having the electrode.

The nano-supported sponge catalyst formed according to the present invention can also be used for numerous other applications such as a resistive material in a field emission display (e.g., ballast resistors) and a catalyst used in catalytic converters, chemical synthesis, fuel cells, pollution control devices, or the production of scanning probe microscope tips, etc. It can be appreciated that the method previously described in this detailed description of preferred embodiments of forming a nano-supported sponge catalyst on a substrate for CNT growth can be accomplished with any number of techniques and variations, and a specific example that is illustrative of the method is provided in Appendix 1. However, it should be understood that the present invention is not limited to the method described in the example provided in Appendix 1.

From the foregoing description, it should be appreciated methods are provided to form a nano-supported sponge catalyst on a substrate for carbon nanotube (CNT) growth that present significant benefits, which are described in the background of the invention and the detailed description of preferred exemplary embodiments, and also would be apparent to one skilled in the art. Furthermore, while preferred exemplary embodiments have been presented in the foregoing description of preferred exemplary embodiments, it should be appreciated that a vast number of variations in the embodiments exist. Lastly, it should be appreciated that these embodiments are preferred exemplary embodiments only, and are not intended to limit the scope, applicability, or configuration of the invention in any way. Rather, the foregoing detailed description provides those skilled in the art with a convenient road map for implementing a preferred exemplary embodiment of the invention. It being understood that various changes may be made in the function and arrangement of elements described in the exemplary preferred embodiments without departing from the spirit and scope of the invention as set forth in the appended claims.

APPENDIX I

1. Individual Nickel and aluminum sources, which are both approximately 99.9% pure, are deposited through a polymer mask (i.e., PMMA) by electron-beam co-evaporation onto molybdenum photo-resist patterned substrate (i.e. borosilicate glass with a molybdenum electrode) to form a thick patterned mixed metal alloy film of about one hundred and fifty nanometers (150 nm) and consisting of about fifty percent (50%) nickel and about fifty percent (50%) aluminum onto substrate.

2. The photo-resist on the substrate is removed by dissolution in acetone and the mixed metal alloy film of the prescribed pattern remained on the substrate.

3. The substrate with the patterned mixed alloy film is immersed for approximately five (5) minutes into a solution containing $NH_4OH$, $H_2O_2$, and $H_2O$ with a mixture ratio of one to one to five (1:1:5) respectively, at a temperature of forty degrees Celsius (40° C.) with the desired chemical reaction of $Al+3NH_4OH \rightarrow Al(OH)_3+NH_4^+$ occurring in the mixed metal alloy film to form a Ni—Al nano-supported sponge catalyst. The $Al(OH)_3$ is the metal oxide nano-support structural element of the Ni—Al nano-supported sponge catalyst.

4. Dry the substrate with the patterned Ni—Al nano-supported sponge catalyst by baking it at about eighty degree Celsius (80° C.) for approximately fifteen (15) minutes.

5. Perform hot filament chemical vapor deposition (HFCVD) growth at about five hundred and eighty degrees Celsius (580° C.) with rhenium filament, and a gas mixture of methane ($CH_4$) and hydrogen ($H_2$) at a four to one mixture ratio for about thirty (30) minutes.

6. The resulting carbon nanotube film can be best described as a tangled carpet of carbon nanotubes with diameters on the order of about one nanometer (1 nm) to about three nanometers (3 nm) and an aspect ratio of ranging from about one thousand (1,000) to about two thousand (2,000).

What is claimed is:

1. A method of forming a nano-supported sponge metal on a substrate, comprising:

depositing an active catalytic metallic element on said substrate;

depositing a structural metallic element with said active catalytic metallic element to form a mixed metal alloy layer on said substrate; and etching said mixed metal alloy layer with an etchant to oxidize said active catalytic metallic element and said structural metallic element and to remove at least a portion of said structural metallic element from a first sub-layer of said mixed metal alloy layer, wherein said first sub-layer of said mixed metal layer is porous and comprised of nano-particles of said active catalytic metallic element that are supported by a metal oxide structure derived from the structural metallic element.

2. The method of claim 1, wherein at least about fifty percent of said mixed metal alloy layer is comprised of the said active catalytic metallic element.

3. The method of claim 1, wherein said active catalytic metallic element and said structural metallic element have different electrochemical selectivity so as to allow said etchant to remove at least a portion of said structural metallic element from said first sub-layer of said mixed metal alloy layer.

4. The method of claim 1, wherein said first sub-layer is electrically coupled to said mixed metal alloy layer.

5. The method of claim 1, wherein said depositing said active catalytic metallic element on said substrate and said depositing said structural metallic element with said active catalytic metallic element to form said mixed metal alloy layer on said substrate is accomplished with a coevaporation deposition.

6. The method of claim 1, wherein said depositing said active catalytic metallic element on said substrate and said depositing said structural metallic element with said active catalytic metallic element to form said mixed metal alloy layer on said substrate is accomplished with an electrodeposition.

7. The method of claim 1, wherein said nano-particles of said active catalytic metallic element within said first sub-layer of said nano-supported sponge catalyst have a surface area to volume ratio of greater than about fifty meter square per gram (50 m$^2$/g).

8. The method of claim 1, wherein said nano-particles of said active catalytic metallic element within said first sub-layer of said nano-supported sponge catalyst have a surface area to volume ratio of greater than about one hundred meter square per gram (100 m$^2$/g).

9. The method of claim 1, wherein said nano-particles of said active catalytic metallic element within said first sub-layer of said nano-supported sponge catalyst have a surface area to volume ratio of greater than about one hundred and fifty meter square per gram (150 m$^2$/g).

10. The method of claim 1, wherein said nano-particles of said active catalytic metallic element within said first sub-layer of said nano-supported sponge catalyst are greater than one tenth of a nanometer but less than about five hundred nanometers.

11. The method of claim 1, wherein said nano-particles of said active catalytic metallic element within said first sub-layer of said nano-supported sponge catalyst are less than about ten nanometers.

12. The method of claim 1, wherein said nano-particles of said active catalytic metallic element within said first sub-layer of said nano-supported sponge catalyst are less than about three nanometers.

13. The method of claim 1, wherein said nano-particles of said active catalytic metallic element within said first sub-layer of said nano-supported sponge catalyst is less than about one nanometer.

14. The method of claim 1, wherein said nano-supported sponge catalyst has a thickness of less than about one micron.

15. The method of claim 1, wherein said active catalytic metallic element is selected from the group consisting of titanium, vanadium, chromium, manganese, copper, zirconium, niobium, molybdenum, technetium, silver, hafnium, tantalum, tungsten, rhenium, gold, ruthenium, rhodium, palladium, osmium, iridium, platinum, iron, cobalt, nickel, and a combination thereof.

16. The method of claim 1, wherein said structural metallic element is selected from the group consisting of aluminum, silicon, magnesium, and a combination thereof.

17. The method of claim 1, further comprising adding a catalytic promoter as a ternary element.

18. The method of claim 17, wherein said ternary element is selected from the group of consisting of calcium, tantalum, hafnium, zirconium, and a combination thereof.

19. The method of claim 1, wherein said substrate is comprised of a support substrate having an electrode; and further comprising of selectively patterning said mixed metal alloy layer before said etching said mixed metal alloy layer.

20. The method of claim 1, wherein said etchant is selected from a group consisting of ammonium hydroxide solution, an alkaline solution, a nitric acid solution, a hydrochloric acid solution, and an acidic solution.

21. The method of claim 1, further comprising conducting a chemical reaction process selected from the group consisting of catalytic decomposition, pyrolysis, chemical vapor deposition, and Hot Filament Chemical Vapor Deposition (HFCVD) to grow at least one nanotube on said nano-supported sponge catalyst.

22. The method of claim 21, wherein said nano-particles of said active catalytic metallic element within said first sub-layer of said nano-supported sponge catalyst do not coalesce during said chemical reaction process.

23. The method of claim 21, wherein said nanotube is a carbon nanotube.

24. The method of claim 21, wherein said chemical reaction process is conducted at least one nanotube growth temperature less than about six hundreds and fifty degrees Celsius.

25. The method of claim 21, wherein said chemical reaction process is conducted at a nanotube growth temperature less than about six hundreds degrees Celsius and greater than five hundreds degrees Celsius.

26. A method of forming at least one nanotube on a substrate comprising of:

depositing an active catalytic metallic element on said substrate;

depositing a structural metallic element with said active catalytic metallic element to form a mixed metal alloy layer on said substrate;

etching said mixed metal alloy layer with an etchant to oxidize said active catalytic metallic element and said structural metallic element and to remove at least a portion of said structural metallic element from a first sub-layer of said mixed metal alloy layer, wherein said first sub-layer of said mixed metal layer is porous and comprised of nano-particles of said active catalytic metallic element that are greater than about one-tenth of a nanometer and less than about five hundred nanometers and are supported by a metal oxide structure derived from the structural metallic element; and conducting a chemical reaction process to grow at least one nanotube on said nano-supported sponge catalyst, wherein said chemical reaction process is conducted at a nanotube growth temperature less than about six hundreds degrees Celsius.

27. The method of claim 26, wherein said mixed metal alloy layer other than said first sub-layer and said first sub-layer form the nano-supported sponge catalyst on said substrate.

28. The method of claim 26, wherein said chemical reaction process is selected from the group consisting of catalytic decomposition, chemical vapor deposition, and Hot Filament Chemical Vapor Deposition (HFCVD).

29. The method of claim 26, wherein said at least one nanotube is single-walled nanotube.

30. The method of claim 26, wherein said at least one nanotube is multi-walled nanotube.

* * * * *